United States Patent
Ishibashi et al.

(10) Patent No.: US 11,990,336 B2
(45) Date of Patent: May 21, 2024

(54) SILICON EPITAXIAL WAFER PRODUCTION METHOD AND SILICON EPITAXIAL WAFER

(71) Applicant: SUMCO CORPORATION, Tokyo (JP)

(72) Inventors: Masayuki Ishibashi, Tokyo (JP); Midori Yoshida, Tokyo (JP); Daisuke Maruoka, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 348 days.

(21) Appl. No.: 17/296,281

(22) PCT Filed: Aug. 5, 2019

(86) PCT No.: PCT/JP2019/030722
§ 371 (c)(1),
(2) Date: May 24, 2021

(87) PCT Pub. No.: WO2020/136973
PCT Pub. Date: Jul. 2, 2020

(65) Prior Publication Data
US 2022/0020585 A1 Jan. 20, 2022

(30) Foreign Application Priority Data
Dec. 27, 2018 (JP) .................. 2018-245109

(51) Int. Cl.
*H01L 21/02* (2006.01)
*C30B 25/10* (2006.01)
*H01L 21/306* (2006.01)

(52) U.S. Cl.
CPC ........ *H01L 21/02532* (2013.01); *C30B 25/10* (2013.01); *H01L 21/02433* (2013.01); *H01L 21/0262* (2013.01); *H01L 21/30625* (2013.01)

(58) Field of Classification Search
CPC ......... H01L 21/02532; H01L 21/02433; H01L 21/0262; H01L 21/30625; H01L 21/02027;
(Continued)

(56) References Cited

U.S. PATENT DOCUMENTS 6,362,510 B1 * 3/2002 Gardner ................ H01L 21/762
257/E21.426
2008/0057323 A1 3/2008 Dohi et al.
(Continued)

FOREIGN PATENT DOCUMENTS

JP 2007-204286 A 8/2007
JP 2008-91891 A 4/2008
(Continued)

OTHER PUBLICATIONS

Office Action for JP App. No. 2018-245109, dated Sep. 7, 2021 (w/ translation).
(Continued)

*Primary Examiner* — Kyoung Lee
(74) *Attorney, Agent, or Firm* — Greenblum & Bernstein, P.L.C.

(57) ABSTRACT

To provide a silicon epitaxial wafer production method and a silicon epitaxial wafer in which the DIC defects can be suppressed, a silicon epitaxial wafer production method is provided, in which an epitaxial layer is grown in a vapor phase on a principal plane of a silicon single crystal wafer. The principal plane is a {110} plane or a plane having an off-angle of less than 1 degree from the {110} plane. The silicon epitaxial wafer production method includes setting a temperature of the silicon single crystal wafer to 1100° C. to 1135° C. and growing the epitaxial layer in the vapor phase at a growth rate of 2.0 μm/min to 3.0 μm/min.

5 Claims, 2 Drawing Sheets

(58) Field of Classification Search
CPC ......... H01L 21/02634; H01L 21/02664; H01L 21/02381; C30B 25/10; C30B 25/20; C30B 29/06; C30B 25/16; C23C 16/24; B24B 1/00
See application file for complete search history.

(56) References Cited

U.S. PATENT DOCUMENTS

| | | |
|---|---|---|
| 2009/0053894 A1 | 2/2009 | Koyata et al. |
| 2011/0031592 A1* | 2/2011 | Ishibashi ................ C30B 25/20 |
| | | 257/E29.004 |
| 2011/0239931 A1 | 10/2011 | Dohi et al. |
| 2017/0011918 A1 | 1/2017 | Torigoe et al. |

FOREIGN PATENT DOCUMENTS

| | | |
|---|---|---|
| JP | 2009-302140 A | 12/2009 |
| JP | 2012-43892 A | 3/2012 |
| JP | 2015-162522 A | 9/2015 |
| WO | WO 2009/150896 A1 | 12/2009 |

OTHER PUBLICATIONS

ISR for PCT/JP2019/030722, dated Oct. 21, 2019 (w/ translation).
U.S. Appl. No. 17/296,279 to Ishibashi et al., filed May 24, 2021.

\* cited by examiner

SILICON EPITAXIAL WAFER PRODUCTION METHOD AND SILICON EPITAXIAL WAFER

CROSS-REFERENCE TO RELATED APPLICATIONS

This application is the U.S. National Stage entry of PCT/JP2019/030722, filed Aug. 5, 2019, which claims priority to JP Application No. 2018-245109, filed Dec. 27, 2018.

TECHNICAL FIELD

The present invention relates to a silicon epitaxial wafer production method and a silicon epitaxial wafer.

BACKGROUND ART

It is known that the use of a silicon wafer whose principal plane is a {110} plane can speed up pMOS transistors because the carrier mobility in the pMOS transistors is higher than that in those obtained from a wafer whose principal plane is a {100} plane. From another aspect, an epitaxial wafer is used as the material for high-performance devices because of very few defects in the epitaxial layer. Thus, an epitaxial wafer whose principal plane is a {110} plane is expected as the material for high-performance devices such as MPUs (Patent Document 1).

PRIOR ART DOCUMENTS

Patent Documents

[Patent Document 1] JP2009-302140A

SUMMARY OF INVENTION

Problems to be Solved by Invention

In the epitaxial wafer whose principal plane is a {110} plane, however, irregularly shaped microscopic step defects having a width of about 100 μm and a height of about 10 nm, which are formed in the epitaxial growth, are likely to occur on the surface, and a problem arises in that DIC defects detected by a differential interference contrast (DIC) method become large. The DIC method is a method capable of detecting the number of irregularly shaped microscopic step defects whose height or depth on the wafer surface exceeds a predetermined threshold of, for example, 2 nm. The microscopic step defects of this type are those having a width of 30 to 200 μm and a height of about 2 to 90 nm, which are difficult to detect by other detection modes.

Problems to be solved by the present invention include providing a silicon epitaxial wafer production method that can suppress the DIC defects and providing a silicon epitaxial wafer in which the DIC defects can be suppressed.

Means for Solving Problems

An aspect of the present invention provides a method for producing a silicon epitaxial wafer in which an epitaxial layer is grown in a vapor phase on a principal plane of a silicon single crystal wafer. The principal plane is a {110} plane or a plane having an off-angle of less than 1 degree from the {110} plane.

The method includes setting a temperature of the silicon single crystal wafer to 1100° C. to 1135° C. and growing the epitaxial layer in the vapor phase at a growth rate of 2.0 μm/min to 3.0 μm/min.

The principal plane of the silicon single crystal wafer is preferably a plane having the off-angle of more than 0 degrees and less than 1 degree from the {110} plane.

After the epitaxial layer is grown in the vapor phase, the surface of the epitaxial layer may be mirror-polished. In this case, the mirror polishing is preferably performed with a polishing margin of more than 0 μm and 0.2 μm or less using a polishing liquid that contains abrasive grains having a grain diameter of 20 nm or less.

Another aspect of the present invention provides a silicon epitaxial wafer in which an epitaxial layer is grown on a silicon single crystal substrate having a principal plane that is a {110} plane or a plane having an off-angle of less than 1 degree from the {110} plane.

When observed using a differential interference contrast method, the epitaxial layer has microscopic step defects on a surface of 1.5 counts/300 mm wafer or less.

When observed using a white-light microscope, the epitaxial layer has a PV value of surface roughness of less than 10 nm.

The principal plane of the silicon single crystal wafer is preferably a plane having the off-angle of more than 0 degrees and less than 1 degree from the {110} plane.

The surface of the epitaxial layer preferably has a haze level (measured in SP2, DWO mode) of 0.4 ppm or less.

The silicon single crystal wafer is preferably a wafer to which boron is added to adjust resistivity to 1 mΩ·cm to 100 mΩ·cm.

Effect of Invention

According to the present invention, there can be provided a silicon epitaxial wafer production method that can suppress the DIC defects and a silicon epitaxial wafer in which the DIC defects can be suppressed.

MODE(S) FOR CARRYING OUT THE INVENTION

Figure 1:
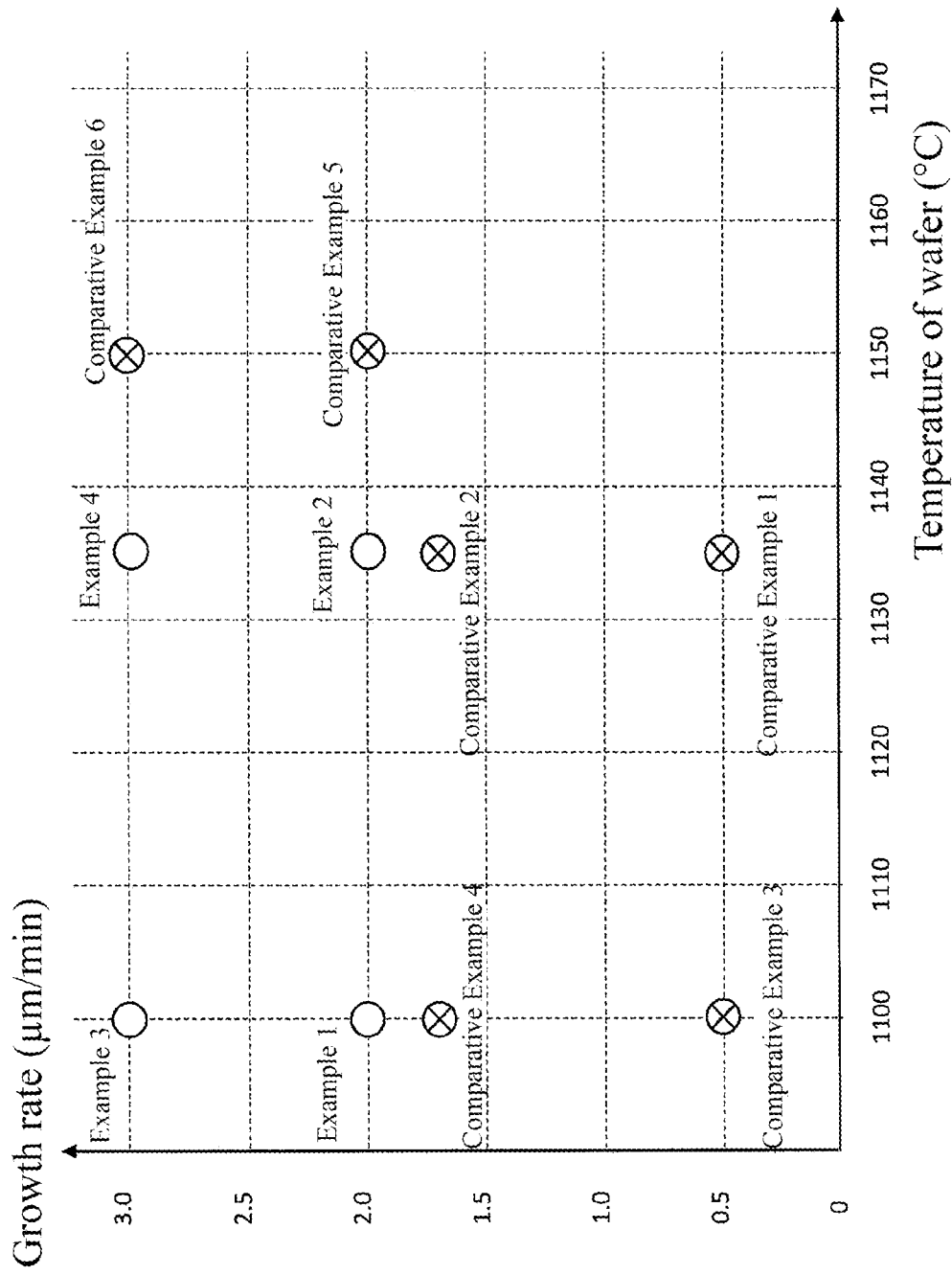
FIG. 1 is a graph illustrating the growth rate and growth temperature (wafer temperature) of Examples 1 to 4 of the present invention and Comparative Examples 1 to 6.

Hereinafter, one or more embodiments of the present invention will be described with reference to the drawings. FIG. 1 is a graph illustrating the growth rate and growth temperature (wafer temperature) of Examples 1 to 4 of the present invention and Comparative Examples 1 to 6.

The silicon epitaxial wafer production method of an embodiment of the present invention is a method in which an epitaxial layer is grown in a vapor phase on the principal plane of a silicon single crystal wafer. The principal plane is a {110} plane or a plane having an off-angle of less than 1 degree from the {110} plane. A wafer whose principal plane has an off-angle of 1 degree or more from the {110} plane causes insufficient device characteristics such as high carrier mobility, and therefore a wafer to which the production method of the present embodiment is preferably applied is a silicon single crystal wafer whose principal plane is a plane having an off-angle of 0 degrees from the {110} plane or a silicon single crystal wafer whose principal plane is a plane having an off-angle of more than 0 degrees and less than 1 degree from the {110} plane. In particular, when using a silicon single crystal wafer whose principal plane is a plane having an off-angle of more than 0 degrees and less than 1 degree from the {110} plane, not only the DIC defects can be reduced, but also the PV value of surface roughness of the epitaxial layer can be made smaller.

When the epitaxial layer is grown in a vapor phase on the principal plane of the silicon single crystal wafer having the above-described crystal plane, the silicon epitaxial wafer production method of the present embodiment is carried out under a condition that the temperature of the wafer is set to 1100° C. to 1135° C. and the growth rate of the epitaxial layer is set to 2.0 μm/min to 3.0 μm/min. More specifically, the temperature of the wafer and the growth rate of the epitaxial layer are set within respective ranges as illustrated in FIG. 1 for Examples 1 to 6, that is, ranges of 1100° C.×2.0 μm/min to 1135° C.×3.0 μm/min. The temperature of the wafer refers to the actual temperature of the wafer loaded into the chamber of a vapor phase growth apparatus and is controlled by the power supplied to a heating lamp and the like. The growth rate of the epitaxial layer refers to the film thickness change per unit time of the epitaxial layer formed on the principal plane of the wafer and is controlled by the concentration and flow amount per unit time (concentration and flow rate) of a reaction gas (raw material gas) (such as silicon tetrachloride $SiCl_4$ or trichlorosilane $SiHCl_3$, for example) supplied into the chamber of the vapor phase growth apparatus.

Figure 2:
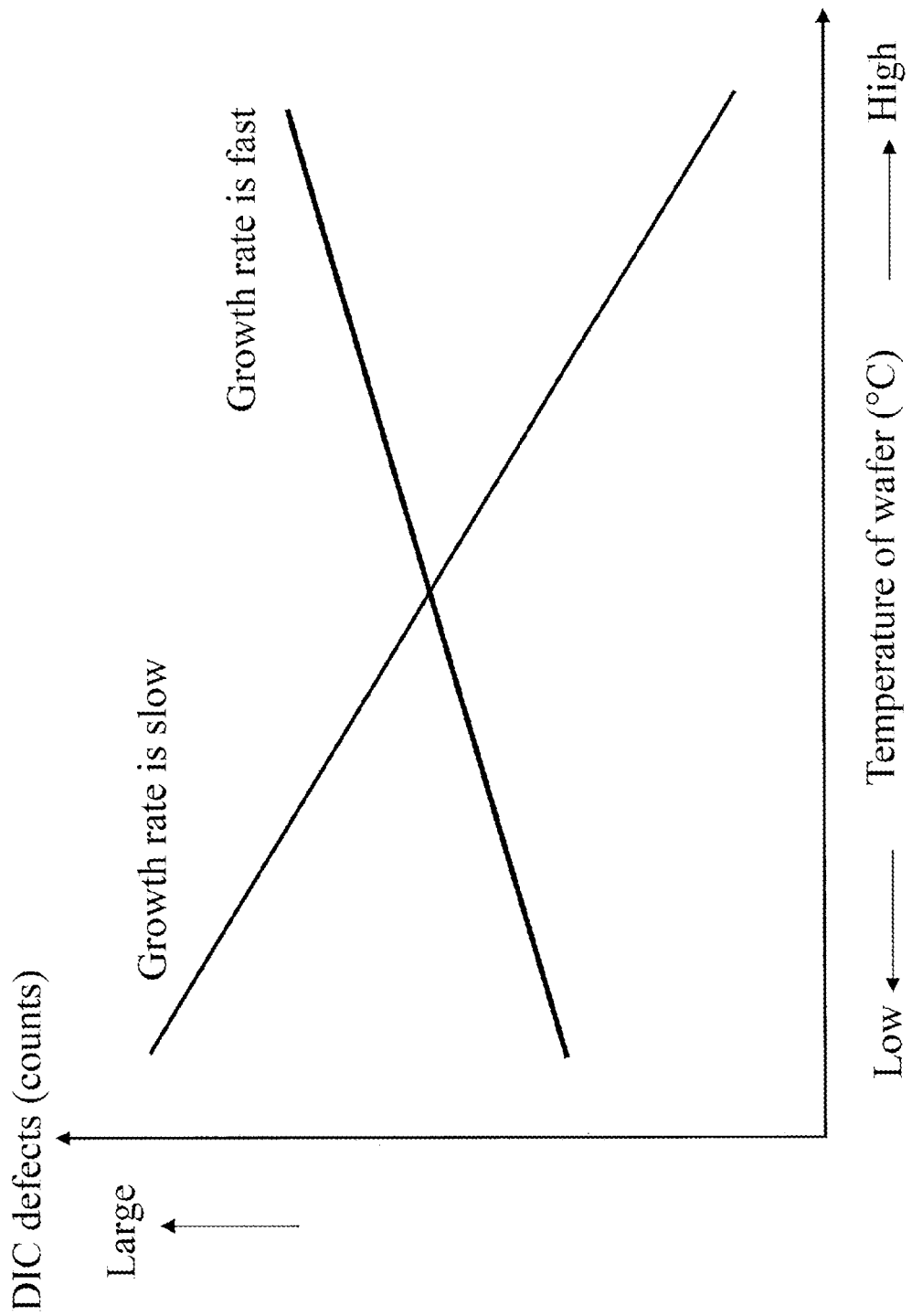
FIG. 2 is a graph illustrating the relationships between the temperature and growth rate of wafers and the DIC defects.

The present inventors studied the relationships between the temperature and growth rate of wafers and the DIC defects and acquired the knowledge as illustrated in FIG. 2. FIG. 2 is a graph illustrating the results of DIC defects when epitaxial layers were formed under conditions including two levels of conditions in which the growth rates of epitaxial layers were set relatively slow and fast and another two levels of conditions in which the temperatures of wafers were set relatively high and low for each of these former two levels. As is found from the results, when the growth rate of the epitaxial layer is set relatively fast, the lower the temperature of wafer is set, the fewer the DIC defects, while when the growth rate of the epitaxial layer is set relatively slow, the higher the temperature of wafer is set, the fewer the DIC defects. Therefore, when the epitaxial layer is grown under a condition of growth rate of 2.0 μm/min to 3.0 μm/min, which is considered to be a relatively fast rate, it is preferred to set the temperature of wafer to 1100° C. to 1135° C., which is considered to be relatively low. Such a condition enables the production of a silicon epitaxial wafer that has microscopic step defects on the surface of 1.5 counts/300 mm wafer or less when observed using a differential interference contrast method and a PV value of surface roughness of less than 10 nm when observed using a white-light microscope.

In the silicon epitaxial wafer production method of the present embodiment, after the epitaxial layer is grown in the vapor phase, the surface of the epitaxial layer may be mirror-polished. In this case, the mirror polishing can be performed with a polishing margin of more than 0 μm and 0.2 μm or less, for example, using a polishing liquid that contains abrasive grains having a grain diameter of 20 nm or less. By mirror-polishing the surface of the epitaxial layer, a silicon epitaxial wafer whose haze level (measured in SP2, DWO mode) on the epitaxial layer's surface is 0.4 ppm or less can be obtained.

To obtain a gettering effect, the silicon single crystal wafer may be a wafer to which boron is added to adjust the resistivity to 1 mΩ·cm to 100 mΩ·cm.

The present invention will now be described in more detail with reference to Examples 1 to 4 of the present invention and Comparative Examples 1 to 6.

A p-type silicon single crystal ingot having a principal axis orientation of <110> and a diameter of 305 mm was produced by a silicon single crystal pulling apparatus using the CZ method. After the outer circumference of that ingot was ground to a diameter of 300 mm, notch processing was performed to cut out a plurality of blocks having resistivity of 1 to 100 mΩ·cm. Each block was sliced using a wire saw so that the inclination of the {110} plane would be off-angles of 0 degrees and 0.35 degrees with respect to the inclination orientation <100>.

The obtained wafers were processed in the order of chamfering, lapping, finish chamfering, etching, double-sided polishing, tape chamfering, edge mirror polishing, and surface single-sided polishing to obtain mirror-polished wafers. Although the description of cleaning processes between the steps is omitted, such cleaning processes were performed as in the ordinary wafer processing. Silicon single crystal epitaxial layers having a thickness of 4 μm were grown on the surfaces of the silicon single crystal wafers thus obtained, using a single-wafer CVD apparatus (Centura available from Applied Materials, Inc.). At that time, the conditions of the growth rate and growth temperature (wafer temperature) for Examples 1 to 4 and Comparative Examples 1 to 6 were set as listed in Table 1.

Each wafer taken out from the CVD apparatus was immediately subjected to a passivation process using an SC-1 cleaning liquid. For a part of the obtained epitaxial wafer, the face of the epitaxial surface was polished by more than 0 μm and 0.2 μm or less using a single-sided polishing apparatus and a polishing liquid containing abrasive grains having a grain diameter of 20 nm or less.

For the obtained epitaxial wafers, the DIC defect density, the PV value of surface roughness, and the haze value were measured. The results are listed in Table 1.

TABLE 1

| | Growth rate (pm/min) | Growth temperature (° C.) | DIC defect density (counts/wafer) Off-angle = 0° | Surface roughness (PV value) (nm) Off-angle = 0° | Surface roughness (PV value) (nm) Off-angle = 35° | Haze value (ppm) Without polishing after EP | Haze value (ppm) With polishing after EP |
|---|---|---|---|---|---|---|---|
| Example 1 | 2.0 | 1100 | 0 | 5 | 3.5 | 0.4 | 0.03 |
| Example 2 | 2.0 | 1135 | 0 | 6 | 4 | 0.4 | 0.03 |
| Example 3 | 3.0 | 1100 | 0 | 5 | 3.5 | 0.4 | 0.03 |

TABLE 1-continued

| | Growth rate (pm/min) | Growth temperature (° C.) | DIC defect density (counts/wafer) Off-angle = 0° | Surface roughness (PV value) (nm) Off-angle = 0° | Surface roughness (PV value) (nm) Off-angle = 35° | Haze value (ppm) Without polishing after EP | Haze value (ppm) With polishing after EP |
|---|---|---|---|---|---|---|---|
| Example 4 | 3.0 | 1135 | 0 | 5 | 3.5 | 0.4 | 0.03 |
| Comparative Example 1 | 0.5 | 1135 | 1000 | 10 | 7 | 0.6 | 0.03 |
| Comparative Example 2 | 1.7 | 1135 | 73941.7 | 22 | 15 | 0.7 | 0.03 |
| Comparative Example 3 | 0.5 | 1100 | 100000 | 25 | 15 | 0.7 | 0.03 |
| Comparative Example 4 | 1.7 | 1100 | 100000 | 24 | 18 | 0.7 | 0.03 |
| Comparative Example 5 | 2.0 | 1150 | 143.7 | 10 | 12 | 0.6 | 0.03 |
| Comparative Example 6 | 3 | 1150 | 100000 | 27 | 17 | 0.7 | 0.03 |

«DIC Defect Density»

The density of microscopic step defects on the surface of the epitaxial layer was measured by the differential interference contrast (DIC) method. Specifically, the measurement was performed in a DIC mode (measurement mode by the DIC method) using a wafer surface inspection apparatus (Surfscan SP3 available from KLA Corporation). In the measurement, the threshold for the height of irregularly shaped microscopic step defects was set to 3 nm, and the number of microscopic step defects exceeding that threshold (per a 300 mm wafer) was counted.

«Surface Roughness PV Value»

The PV (Peak to Valley) value representing the surface roughness of the surface of epitaxial layer was obtained using a white-light microscope. The white-light microscope is configured to obtain a 3D image through dividing an LED beam by a half mirror, irradiating a reference surface and a sample surface with the divided beams, and while swinging this in the Z direction, forming an image at the focal position at which the interference between the beam returned from the reference surface and the beam returned from the sample surface is the strongest.

«Haze Value»

The haze value on the surface of the epitaxial layer was measured in a DWO mode (Dark Field Wide Oblique mode, dark field wide oblique incidence mode) using a surface inspection apparatus (Surfscan SP2 available from KLA Corporation).

«Consideration»

As listed in Table 1 as Examples 1 to 4, when the epitaxial layer is grown in a vapor phase on the principal plane of the silicon single crystal wafer having the above-described crystal plane under a condition that the temperature of the wafer is set to 1100° C. to 1135° C. and the growth rate of the epitaxial layer is set to 2.0 µm/min to 3.0 µm/min, the DIC defect density can be reduced to 1.5 counts or less per a 300 mm wafer, and the PV value of surface roughness can also be reduced to less than 10 nm. In this case, for the silicon single crystal wafers whose principal plane is a plane having an off-angle from the {110} plane of more than 0 degrees and less than 1 degree, specifically 0.35 degrees, the PV value of surface roughness can be further improved to 4 nm or less.

Furthermore, for the wafers in which the surface of the epitaxial layer is mirror-polished, the haze level can be improved to about 0.03 ppm as compared with the haze level before the mirror polishing of about 0.4 ppm, and the quality control of light point defects (LPD) and the like is therefore possible using a particle counter.

In contrast, the DIC defect density is very large in Comparative Examples 5 to 6 for which the wafer temperature of the growth conditions for the epitaxial layer is higher than 1135° C. and Comparative Examples 1 to 4 for which the growth rate of the epitaxial layer is slower than 2.0 µm/min.

The invention claimed is:

1. A method for producing a silicon epitaxial wafer in which an epitaxial layer is grown in a vapor phase on a principal plane of a silicon single crystal wafer, the principal plane being a plane or a plane having an off-angle of less than 1 degree from the plane, the method comprising:
   setting a temperature of the silicon single crystal wafer to 1100° C. to 1135° C.; and
   growing the epitaxial layer in the vapor phase at a growth rate of 2.0 µm/min to 3.0 µm/min so that a number of microscopic step defects having a height over 3 nm on a surface of the epitaxial layer when observed using a differential interference contrast method is 1.5/300 mm wafer or less.

2. The method according to claim 1, wherein the principal plane of the silicon single crystal wafer is a plane having the off-angle of more than 0 degrees and less than 1 degree from the plane.

3. The method according to claim 1, comprising
   mirror-polishing a surface of the epitaxial layer after growing the epitaxial layer in the vapor phase.

4. The method according to claim 3, wherein the mirror polishing is performed with a polishing margin of more than 0 µm and 0.2 µm or less using a polishing liquid that contains abrasive grains having a grain diameter of 20 nm or less.

5. The method according to claim 1, wherein when observed using a white-light microscope, the epitaxial layer has a PV value of surface roughness of less than 10 nm.

* * * * *

UNITED STATES PATENT AND TRADEMARK OFFICE
CERTIFICATE OF CORRECTION

PATENT NO. : 11,990,336 B2  
APPLICATION NO. : 17/296281  
DATED : May 21, 2024  
INVENTOR(S) : Ishibashi et al.

Page 1 of 1

It is certified that error appears in the above-identified patent and that said Letters Patent is hereby corrected as shown below:

In the Claims

Column 6, Line 38 (Claim 1), please change "being a plane" to -- being a {110} plane --.
Column 6, Line 39 (Claim 1), please change "from the plane" to -- from the {110} plane --.
Column 6, Line 51 (Claim 2), please change "from the plane" to -- from the {110} plane --.

Signed and Sealed this
Seventeenth Day of September, 2024

Katherine Kelly Vidal
*Director of the United States Patent and Trademark Office*